US011313913B2

(12) United States Patent
Shimizu (10) Patent No.: US 11,313,913 B2
(45) Date of Patent: Apr. 26, 2022

(54) BATTERY MONITORING APPARATUS

(71) Applicant: DENSO CORPORATION, Kariya (JP)

(72) Inventor: Takumi Shimizu, Kariya (JP)

(73) Assignee: DENSO CORPORATION, Kariya (JP)

( * ) Notice: Subject to any disclaimer, the term of this patent is extended or adjusted under 35 U.S.C. 154(b) by 538 days.

(21) Appl. No.: 16/265,071

(22) Filed: Feb. 1, 2019

(65) Prior Publication Data

US 2019/0235029 A1    Aug. 1, 2019

(30) Foreign Application Priority Data

Feb. 1, 2018    (JP) .............................. JP2018-016575

(51) Int. Cl.
*G01R 31/3835*    (2019.01)
*G01R 31/3842*    (2019.01)

(52) U.S. Cl.
CPC ..... *G01R 31/3835* (2019.01); *G01R 31/3842* (2019.01)

(58) Field of Classification Search
CPC .............. G01R 31/3648; G01R 31/364; G01R 31/367; G01R 31/3835; G01R 31/3842; G01R 31/392; Y02E 60/10; H02J 7/005
See application file for complete search history.

(56) References Cited

U.S. PATENT DOCUMENTS

| 2011/0050237 | A1 | 3/2011 | Sekizaki et al. |
| 2011/0204898 | A1 | 8/2011 | Kim et al. |
| 2014/0303914 | A1* | 10/2014 | Sejima ............... G01R 31/3842 702/63 |
| 2014/0312915 | A1* | 10/2014 | Mukaitani ............ G01R 31/382 324/434 |

FOREIGN PATENT DOCUMENTS

| JP | 2000-270492 A | 9/2000 |
| JP | 2009-168720 A | 7/2009 |
| JP | 2011-027608 A | 2/2011 |
| JP | 2012-083123 A | 4/2012 |
| JP | 2012-154641 A | 8/2012 |

* cited by examiner

*Primary Examiner* — Son T Le
*Assistant Examiner* — Dustin R Dickinson
(74) *Attorney, Agent, or Firm* — Oliff PLC (57) ABSTRACT

A battery monitoring apparatus acquires a first physical quantity detected by a first detecting unit, and acquires a second physical quantity detected by a second detecting unit at each predetermined detection period. The battery monitoring apparatus stores the acquired first physical quantity and the acquired second physical quantity in association with respective time parameters. The time parameter is a time of detection of the respective first or second physical quantity or a correlation value that is correlated with the time of detection of the respective first or second physical quantity. The battery monitoring apparatus monitors a state of a storage battery using a set of first physical quantity and second physical quantity of which a difference in the time of detection is shorter than the detection period, among the first physical quantities and the second physical quantities stored by the battery monitoring apparatus, based on the time parameters.

8 Claims, 9 Drawing Sheets

BATTERY MONITORING APPARATUS

CROSS-REFERENCE TO RELATED APPLICATION

This application is based on and claims the benefit of priority from Japanese Patent Application No. 2018-016575, filed Feb. 1, 2018. The entire disclosure of the above application is incorporated herein by reference.

BACKGROUND

Technical Field

The present disclosure relates to a battery monitoring apparatus that monitors a storage battery.

Related Art

For example, as can be seen in JP-A-2011-47683 described hereafter, a following battery monitoring apparatus is known as the type of battery monitoring apparatus described above. That is, the battery monitoring apparatus takes into consideration a time delay (wait time) from when a voltage detection startup command is issued to a voltage monitoring integrated circuit (IC) through communication until the voltage of the storage battery is actually detected, and detects a charge-discharge current at a detection timing that is set taking into consideration the time delay. As a result of the charge-discharge current being detected at the detection timing that is set taking into consideration the time delay attributed to communication, the battery monitoring apparatus is capable of monitoring the state of the storage battery using the voltage and the charge-discharge current detected at synchronized timings.

In the above-described battery monitoring apparatus, the voltage is required to be detected at a detection timing that is prescribed in advance. Therefore, the battery monitoring apparatus is unable to perform a process other than detection at this detection timing. The battery monitoring apparatus may be required to change or delay the execution timings of other processes.

In addition, the above-described time delay differs depending on the configuration and type of a voltage detecting unit that detects the voltage of the storage battery. Therefore, the detection timing also differs depending on the voltage detecting unit. Consequently, even if the execution timing of another process is determined based on the detection timing of a certain voltage detecting unit, the determined execution timing and the detection timing may overlap regarding another voltage detecting unit. Determination of the execution timing for each voltage detecting unit may be required. Therefore, a technology that enables the state of a storage battery to be appropriately monitored through use of a voltage that is detected at an arbitrary detection timing is desired. Such an issue is not limited to the voltage detection timing, but rather, is a common issue in cases in which, when two physical quantities used to monitor a storage battery are detected at synchronized timings, the detection timing of either of the physical quantities is to be determined.

SUMMARY

It is thus desired to provide a battery monitoring apparatus that is capable of appropriately monitoring a state of a storage battery using a physical quantity that is detected at an arbitrary detection timing.

An exemplary embodiment of the present disclosure provides a battery monitoring apparatus for a battery monitoring system that includes a first detecting unit that detects a first physical quantity of a storage battery and a second detecting unit that detects a second physical quantity of the storage battery. The battery monitoring apparatus includes: a first acquiring unit that acquires the first physical quantity detected by the first detecting unit; a second acquiring unit that acquires the second physical quantity detected by the second detecting unit at each predetermined detection period; a storage unit that stores the first physical quantity acquired by the first acquiring unit and the second physical quantity acquired by the second acquiring unit in association with respective time parameters, the time parameter being a time of detection of the respective first or second physical quantity or a correlation value that is correlated with the time of detection of the respective first or second physical quantity; and a state monitoring unit that monitors a state of the storage battery using a set of first physical quantity and second physical quantity of which a difference in the time of detection is shorter than the detection period, among the first physical quantities and the second physical quantities stored by the storage unit, based on the time parameters.

In the present disclosure, the second acquiring unit acquires the second physical quantity that is detected by the second detecting unit at each predetermined detection period. Therefore, even if the first physical quantity is detected at an arbitrary detection timing, the first physical quantity and the second physical quantity of which the difference in the time of detection is shorter than the detection period and that are detected at substantially synchronized timings are stored. Consequently, through use of this set of first physical quantity and second physical quantity, the state of the storage battery can be appropriately monitored using the first physical quantity that is detected at an arbitrary timing.

DESCRIPTION OF THE EMBODIMENTS

First Embodiment

A first embodiment in which a battery monitoring apparatus of the present disclosure is applied to a vehicle (such as a hybrid car or an electric car) that includes a rotating electric machine as an onboard main machine will hereinafter be described with reference to the drawings.

Figure 1:
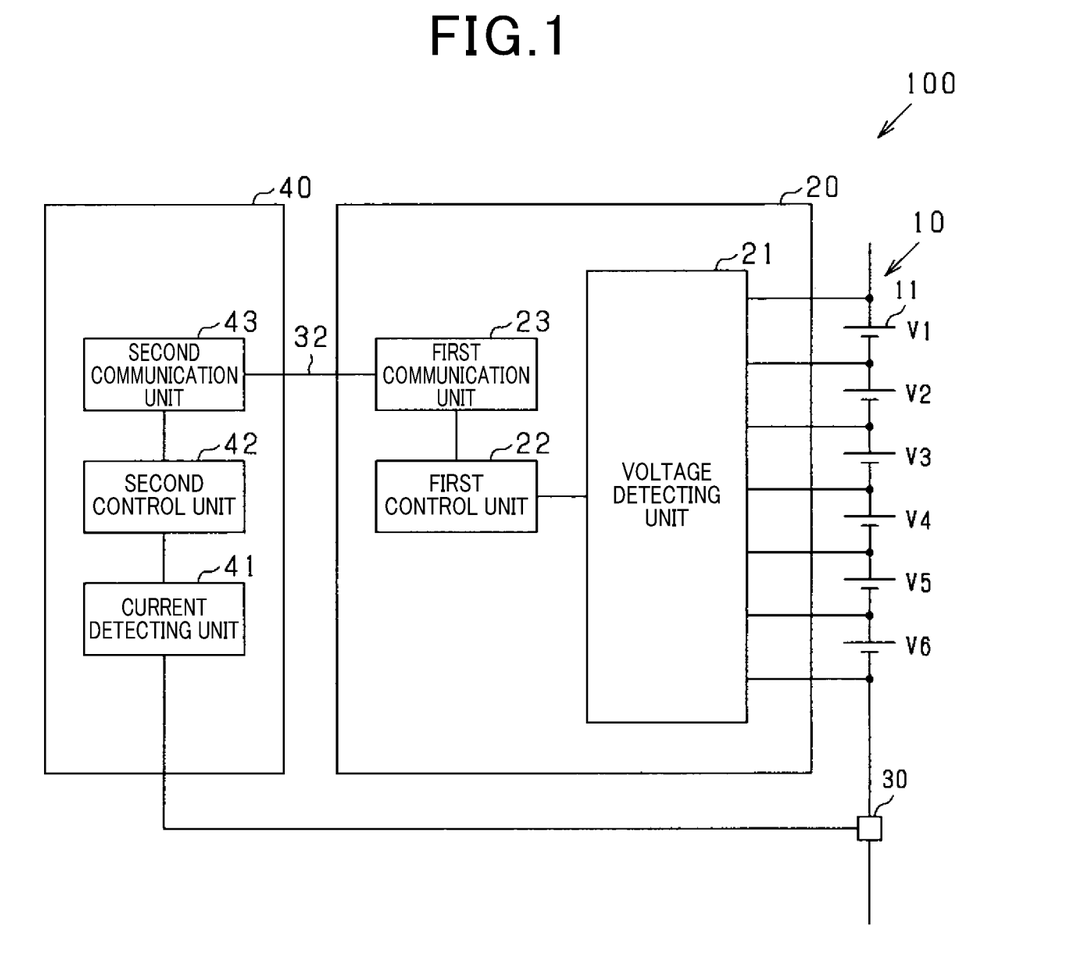
FIG. 1 is a schematic diagram of a configuration of a battery monitoring system.

As shown in FIG. 1, a battery monitoring system 100 according to the present embodiment includes an assembled battery (battery pack) 10, a cell voltage sensor (CVS) 20, a current sensor 30, and a battery management unit (BMU) 40.

The assembled battery 10 is a storage battery that has an inter-terminal voltage V that is, for example, equal to or greater than 100 volts. The assembled battery 10 is configured by a plurality of battery modules 11 being connected in series. In addition, the battery module 11 is configured by a plurality of battery cells being connected in series. For example, a lithium-ion storage battery or a nickel-hydrogen storage battery may be used as the battery cell. According to the present embodiment, the battery module 11 corresponds to a "storage battery."

The CVS 20 includes a voltage detecting unit 21, a first control unit 22, and a first communication unit 23. The voltage detecting unit 21 detects the inter-terminal voltage V of each battery module 11 configuring the assembled battery 10. According to the present embodiment, the voltage detecting unit 21 detects the inter-terminal voltage V by a flying capacitor method. Voltage detection by the flying capacitor method will be described with reference to FIG. 2. According to the present embodiment, the CVS 20 corresponds to a "first apparatus." In addition, the inter-terminal voltage V corresponds to a "first physical quantity." The voltage detecting unit 21 corresponds to a "first detecting unit."

Figure 2:
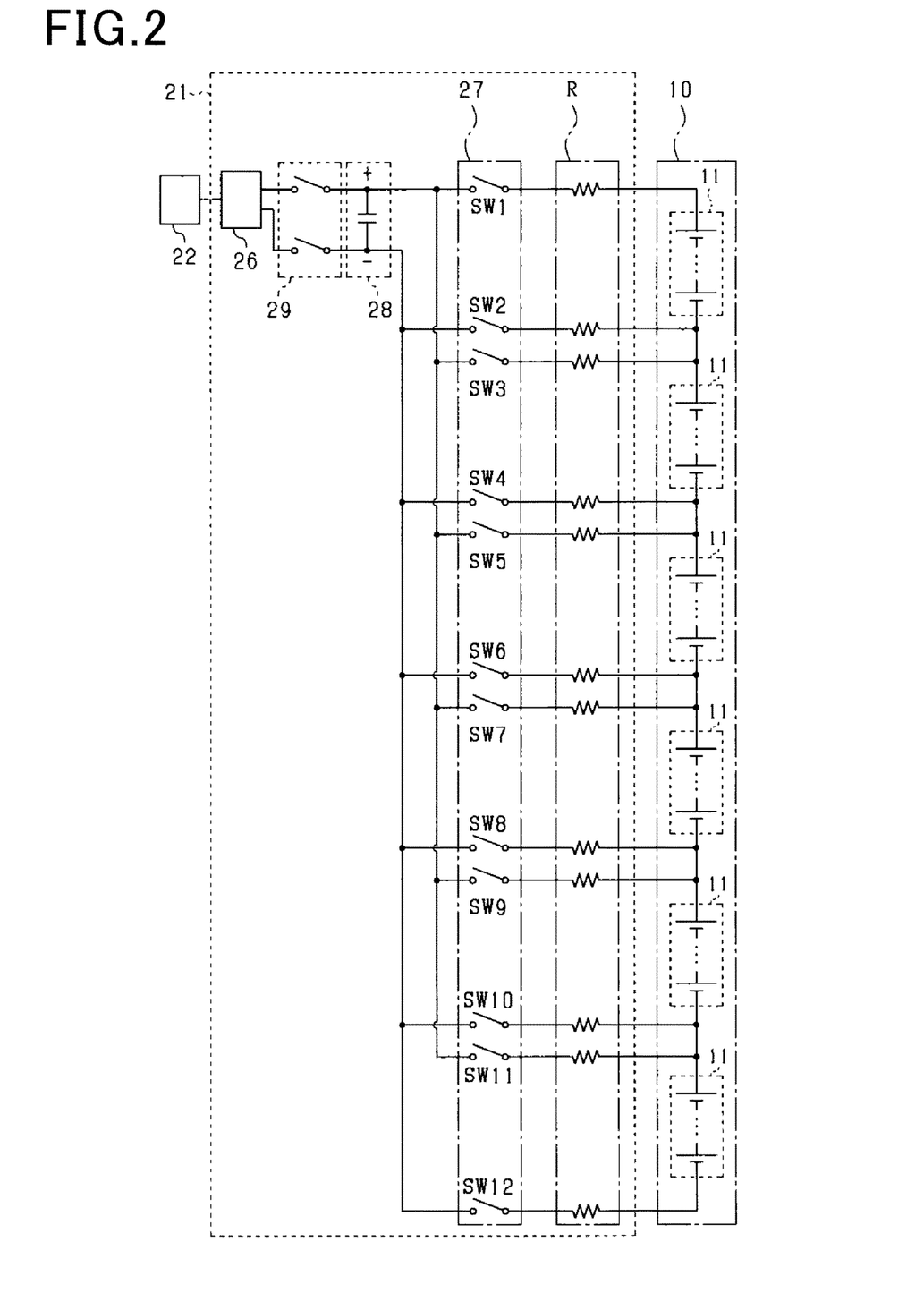
FIG. 2 is a schematic diagram of a configuration of a voltage detecting unit.

According to the present embodiment, the assembled battery 10 is configured by six battery modules 11. The voltage detecting unit 21 includes a voltage amplifier 26, a plurality of resistor elements R, a multiplexer 27, a capacitor 28, and an output-side switch 29. The plurality of resistor elements R are arranged between the battery module 11 and the voltage amplifier 26. The multiplexer 27 includes a plurality of switches SW1 to SW12. Hereafter, the switches SW1 to SW12 provided in the multiplexer 27 are referred to as input-side switches SW1 to SW12.

In a state in which the output-side switch 29 is turned off, the voltage detecting unit 21 turns on a switch SWi (i=1, 3, 5, 7, 9, 11) that is provided on a high-voltage side of any of the battery modules 11 and a switch SWi+1 that is provided on a low-voltage side. The voltage detecting unit 21 thereby connects the battery module 11 and the capacitor 28. When the battery module 11 and the capacitor 28 are connected via the resistor elements R, and the switches SWi and SWi+1, the capacitor 28 is charged by the voltage of the battery module 11.

When charging of the capacitor 28 is completed, the voltage detecting unit 21 turns off all input-side switches SW1 to SW12 and turns on the output-side switch 29. As a result, the voltage of the capacitor 28 is inputted to the voltage amplifier 26 and converted to a digital signal. The first control unit 22 then acquires the digital signal outputted from the voltage amplifier 26 and thereby acquires the inter-terminal voltage V of the battery module 11 that has charged the capacitor 28.

Here, in voltage detection by the flying capacitor method, time is required to charge the capacitor 28 when the inter-terminal voltage V of the battery module 11 is detected. Therefore, a detection time Td (see FIG. 5) is required for the inter-terminal voltage V of a single battery module 11 to be detected once. The detection time Td corresponds to a time constant that is prescribed by a capacitance value of the capacitor 28 and a resistance value of the resistor element R.

Consequently, in the voltage detecting unit 21, a fixed voltage detection period Pv (see FIG. 5) is required for the inter-terminal voltages V of all battery modules 11 configuring the assembled battery 10 to be detected. For example, the voltage detection period Pv is 10 milliseconds. According to the present embodiment, the voltage detection period Pv corresponds to a "first detection period."

The first control unit 22 is a control apparatus that is configured by a central processing unit (CPU), a read-only memory (ROM), a random access memory (RAM), and the like. The first control unit 22 stores the inter-terminal voltage V of the battery module 11 acquired from the voltage detecting unit 21 in the RAM or the like that is provided therein. In addition, the first control unit 22 is communicably connected to the BMU 40 by the first communication unit 23 and an onboard network interface 32. For example, a known interface, such as a controller area network (CAN) or a local interconnect network (LIN), may be used as the onboard network interface 32. Furthermore, a wireless communication method may be used as the communication method, in addition to a wired communication method.

The BMU 40 includes a current detecting unit 41, a second control unit 42, and a second communication unit 43. The current detecting unit 41 detects a charge-discharge current I that flows to the assembled battery 10 (that is, the battery modules 11) using the current sensor 30. According to the present embodiment, the BMU 40 corresponds to a "second apparatus." In addition, the charge-discharge current I corresponds to a "second physical quantity." The current detecting unit 41 corresponds to a "second detecting unit."

Figure 5:
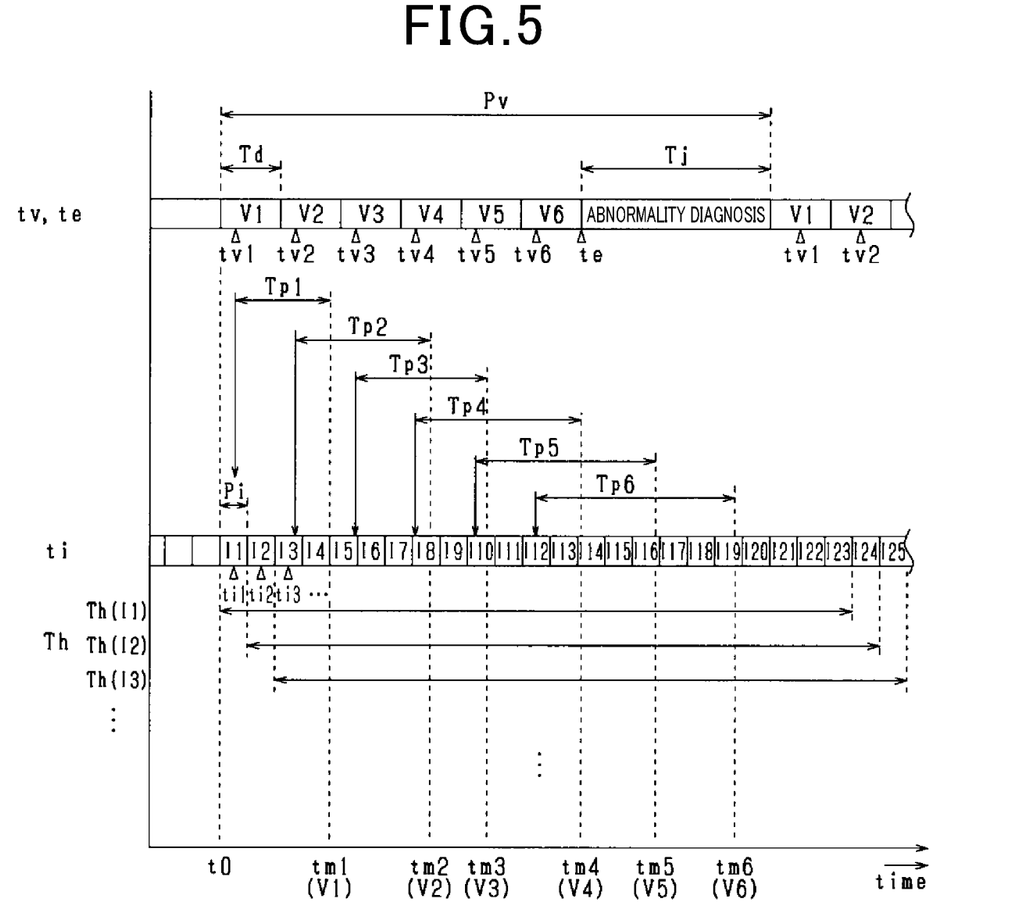
FIG. 5 is a time chart of an example of the battery monitoring process according to the first embodiment.

Here, the current detecting unit 41 detects the charge-discharge current I at every fixed current detection period Pi (see FIG. 5). For example, the current detection period Pi is 0.5 milliseconds. The current detection period Pi is shorter than the voltage detection period Pv. In addition, according to the present embodiment, the current detection period Pi is shorter than the detection time Td. According to the present embodiment, the current detection period Pi corresponds to a "detection period" and a "second detection period."

The second control unit 42 is a control apparatus that is configured by a CPU, a ROM, a RAM, and the like. When the charge-discharge current I flowing to the battery modules 11 is acquired from the current detecting unit 41, the second control unit 42 stores the charge-discharge current I in the RAM or the like that is provided therein. In addition, the second control unit 42 is communicably connected to the CVS 20 by the second communication unit 43 and the onboard network interface 32. According to the present embodiment, the second control unit 42 corresponds to a "battery monitoring apparatus."

Figure 3:
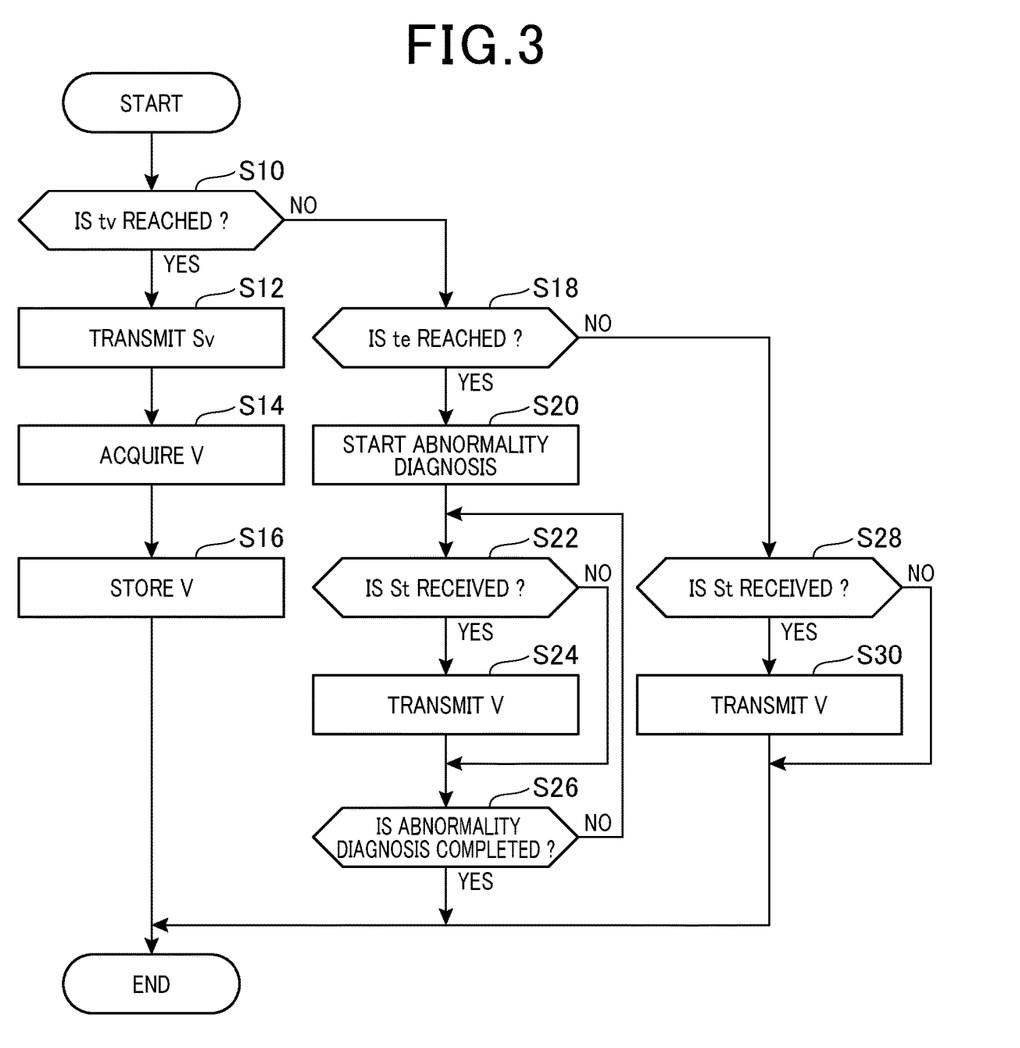
FIG. 3 is a flowchart of the steps in a voltage detection process according to the first embodiment.

Next, a voltage detection process will be described with reference to FIG. 3. Here, FIG. 3 is a flowchart of the steps in the voltage detection process. The first control unit 22 of the CVS 20 repeatedly performs the voltage detection process at, for example, a predetermined first processing cycle.

In this series of processes, first, at step S10, the first control unit 22 determines whether a voltage detection timing tv is reached. The voltage detection timing tv is set for each battery module 11, for each voltage detection period Pv. In addition, the voltage detection timing tv is shifted by the detection time Td between each battery module 11.

When a YES determination is made at step S10 (i.e., the first control unit 22 determines that the voltage detection timing tv is reached), at step S12, the first control unit 22 transmits a voltage detection signal Sv to the voltage detecting unit 21. At subsequent step S14, the first control unit 22 acquires, from the voltage detecting unit 21, the inter-terminal voltage V of the battery module 11 to be subjected to detection that has been detected by the voltage detecting unit 21 in accompaniment with the transmission of the voltage detection signal Sv. At subsequent step S16, the first control unit 22 stores the inter-terminal voltage V acquired at step S14 in association with the voltage detection timing tv. The first control unit 22 then ends the voltage detection process.

Meanwhile, when a NO determination is made at step S10 (i.e., the first control unit 22 determines that no voltage detection timing tv is reached), at step S18, the first control unit 22 determines whether a diagnosis timing te (see FIG. 5) is reached. The diagnosis timing te is a timing at which abnormality diagnosis of the assembled battery 10 is started. The first control unit 22 performs the abnormality diagnosis in addition to the detection of the inter-terminal voltage V of each battery module 11 during the voltage detection period Pv. In the abnormality diagnosis, the first control unit 22 diagnoses overcharging, over-discharging, and the like of the battery module 11 using the inter-terminal voltage V acquired at step S14.

The first control unit 22 is unable to simultaneously perform the detection of the inter-terminal voltage V and the abnormality diagnosis. The first control unit 22 performs the abnormality diagnosis at a time differing from the detection time Td of each battery module 11. Therefore, the voltage detection period Pv includes a diagnosis time Tj (see FIG. 5) over which the abnormality diagnosis is performed, separately from the detection time Td over which the inter-terminal voltage V of the battery module 11 is detected. During the diagnosis time Tj, the first control unit 22 is unable to detect the inter-terminal voltage V and stops the detection of the inter-terminal voltage V by the voltage detecting unit 21. According to the present embodiment, the abnormality diagnosis corresponds to a "predetermined process." The diagnosis time Tj corresponds to a "control time."

When a YES determination is made at step S18 (i.e., the first control unit 22 determines that the diagnosis timing to is reached), the first control unit 22 starts the abnormality diagnosis at step S20. At subsequent step S22, the first control unit 22 determines whether a transmission request signal St is received. The transmission request signal St is a signal that requests transmission of the inter-terminal voltage V stored at step S16. The transmission request signal St is received from the BMU 40. The battery module 11 of the inter-terminal voltage V of which transmission is requested is designated in the transmission request signal St.

Processing by the first control unit 22 is required for the transmission of the inter-terminal voltage V. However, processing load placed on the first control unit 22 for the transmission of the inter-terminal voltage V is less than the processing loads for the detection of the inter-terminal voltage V and the abnormality diagnosis. Therefore, the first control unit 22 can perform the transmission of the inter-terminal voltage V during the detection time Td and the diagnosis time Tj.

When a NO determination is made at step S22 (i.e., the first control unit 22 determines that no transmission request signal St is received), the first control unit 22 proceeds to step S26. When a YES determination is made at step S22 (i.e., the first control unit 22 determines that the transmission request signal St is received), at step S24, the first control unit 22 associates the inter-terminal voltage V of the battery module 11 designated in the transmission request signal St with elapsed time Tp and transmits the inter-terminal voltage V to the BMU 40. The elapsed time Tp is an amount of time from the voltage detection timing tv of the inter-terminal voltage V to the time at which the transmission request signal St is received. That is, the first control unit 22 performs the transmission of the inter-terminal voltage V during the diagnosis time Tj. According to the present embodiment, the elapsed time Tp corresponds to a "correlation value" and a "time parameter."

At step S26, the first control unit 22 determines whether the abnormality diagnosis is completed. When a NO determination is made at step S26 (i.e., the first control unit 22 determines that no abnormality diagnosis is completed), the first control unit 22 returns to step S22. When a YES determination is made at step S26 (i.e., the first control unit 22 determines that the abnormality diagnosis is completed), the first control unit 26 ends the voltage detection process.

Meanwhile, when a NO determination is made at step S18 (i.e., the first control unit 22 determines that no diagnosis timing to is reached), at step S28, the first control unit 22 determines whether the transmission request signal St has been received. The NO determination made at step S18 indicates that the timing is other than the voltage detection timing tv during the detection time Td.

When a NO determination is made at step S28 (i.e., the first control unit 22 determines that the transmission request signal St has not been received), the first control unit 22 ends the voltage detection process. When a YES determination is made at step S28 (i.e., the first control unit 22 determines that the transmission request signal St has been received), at step S30, the first control unit 22 associates the inter-terminal voltage V with the elapsed time Tp and transmits the inter-terminal voltage V to the BMU 40. The first control unit 22 then ends the voltage detection process. That is, the first control unit 22 performs the transmission of the inter-terminal voltage V during the detection time Td.

Figure 4:
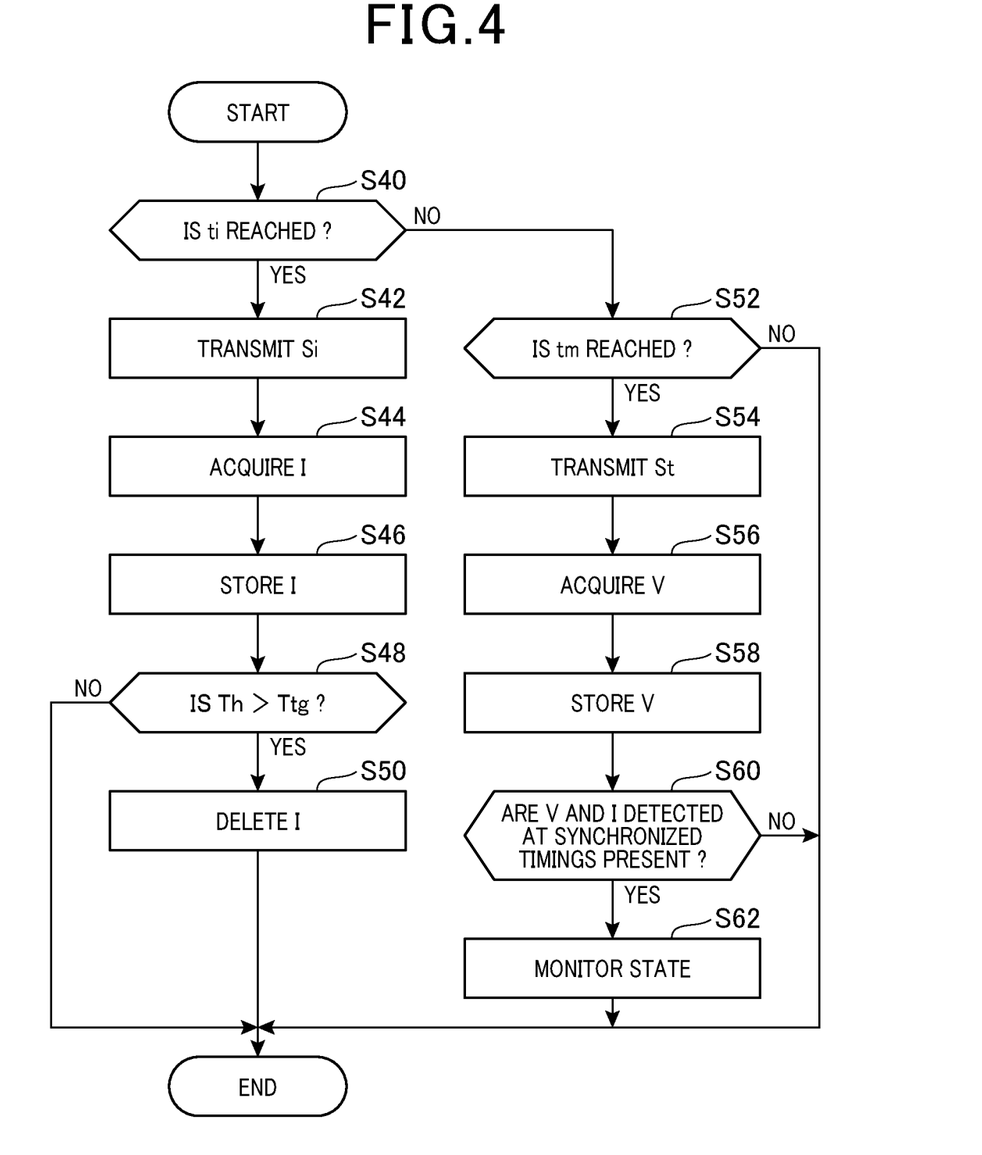
FIG. 4 is a flowchart of the steps in a battery monitoring process according to the first embodiment.

Next, a battery monitoring process according to the present embodiment will be described with reference to FIG. 4. Here, FIG. 4 is a flowchart of the steps in the battery monitoring process. The second control unit 42 of the BMU 40 repeatedly performs the battery monitoring process at, for example, a predetermined second processing cycle.

In this series of processes, first, at step S40, the second control unit 42 determines whether a current detection timing ti is reached. The current detection timing ti is set for each current detection period Pi. When a YES determination is made at step S40 (i.e., the second control unit 42 determines that the current detection timing ti is reached), at step S42, the second control unit 42 transmits a current detection signal Si to the current detecting unit 41.

At subsequent step S44, the second control unit 42 acquires, from the current detecting unit 41, the charge-discharge current I detected by the current detecting unit 41 in accompaniment with the transmission of the current detection signal Si. That is, the second control unit 42 acquires the charge-discharge current I that is detected at each predetermined current detection period Pi by the current detecting unit 41. According to the present embodiment, the process at step S44 corresponds to a "second acquiring unit."

At step S46, the second control unit 42 stores the charge-discharge current I acquired at step S44 in association with the current detection timing ti of the charge-discharge current I. As a result, the charge-discharge current I is associated with the elapsed time Tp, described hereafter, through the current detection timing ti.

When the charge-discharge current I is stored at step S46, at step S48, the second control unit 42 determines whether a charge-discharge current I of which a storage time Th exceeds a predetermined set time Ttg is present among the charge-discharge currents I stored at step S46. The storage time Th is an amount of time elapsed from when the charge-discharge current I is stored. A differing storage time Th is set for each charge-discharge current I detected at a differing current detection timing ti.

In addition, the predetermined set time Ttg is a maximum amount of time over which the charge-discharge current I is stored in the second control unit 42. The set time Ttg is determined based on a storage capacity set in the second control unit 42 for storing the charge-discharge currents I. According to the present embodiment, the set time Ttg is set to an amount of time that is longer than the voltage detection period Pv and shorter than twice the voltage detection period Pv.

When a NO determination is made at step S48 (i.e., the second control unit 42 determines that no charge-discharge current I of which a storage time Th exceeds a predetermined set time Ttg is present among the stored charge-discharge currents I), the second control unit 42 ends the battery monitoring process.

When a YES determination is made at step S48 (i.e., the second control unit 42 determines that the charge-discharge current I of which a storage time Th exceeds a predetermined set time Ttg is present among the stored charge-discharge currents I), at step S50, the second control unit 42 deletes the charge-discharge current I of which the storage time Th exceeds the set time Ttg from the RAM or the like provided in the second control unit 42. The second control unit 42 then ends the battery monitoring process. According to the present embodiment, the process at step S50 corresponds to a "deleting unit."

Meanwhile, when determined NO at step S40 (i.e., the second control unit 42 determines that no current detection timing ti is reached), at step S52, the second control unit 42 determines whether a transmission timing tm is reached. The transmission timing tm is a timing at which the transmission request signal St is transmitted. The transmission timing tm can be set to an arbitrary timing that is after the detection timing Td corresponding to the battery module 11 that is designated at this transmission timing tm and within the corresponding voltage detection period Pv.

When a NO determination is made at step S52 (i.e., the second control unit 42 determines that no transmission timing tm is reached), the second control unit 42 ends the battery monitoring process. When a YES determination is made at step S52 (i.e., the second control unit 42 determines that the transmission timing tm is reached), at step S54, the second control unit 42 transmits the transmission request signal St to the CVS 20.

At subsequent step S56, the second control unit 42 acquires the inter-terminal voltage V of the battery module 11, in association with the elapsed time Tp thereof, that is transmitted from the CVS 20 based on the transmission request signal St. According to the present embodiment, the process at step S54 corresponds to a "request transmitting unit." The process at step S56 corresponds to a "first acquiring unit."

At step S58, the second control unit 42 stores the inter-terminal voltage V acquired at step S56 in association with the elapsed time Tp thereof. According to the present embodiment, the processes at step S46 and step S58 correspond to a "storage unit."

When the inter-terminal voltage V is stored at step S58, at step S60, the second control unit 42 determines whether a set of inter-terminal voltage V and charge-discharge current I detected at substantially synchronized timings is present among the inter-terminal voltages V and the charge-discharge currents I stored at steps S56 and S48.

Specifically, first, the second control unit 22 calculates the elapsed time Tp to the time at which the transmission request signal St is transmitted (that is, the transmission timing tm) using information on the associated current detection timing ti of each charge-discharge current I stored at step S46. Next, the second control unit 42 compares the elapsed time Tp of the inter-terminal voltage V and the elapsed time Tp the charge-discharge current I, and determines whether or not a set of inter-terminal voltage V and charge-discharge current I of which the difference in elapsed time Tp, that is, the difference between the current detection timing ti and the voltage detection timing tv is shorter than the current detection period Pi is present.

For example, when the charge-discharge current I is not acquired as a result of detection error in the current detecting unit 41 or the like, the second control unit 42 makes a NO determination at step S60 (i.e., the second control unit 42 determines that no set of inter-terminal voltage V and charge-discharge current I detected at substantially synchronized timings is present) and ends the battery monitoring process.

Meanwhile, when a YES determination is made at step S60 (i.e., the second control unit 42 determines that the set of inter-terminal voltage V and charge-discharge current I detected at substantially synchronized timings is present), at step S62, the second control unit 42 monitors the state of the battery module 11 using the set of inter-terminal voltage V and charge-discharge current I of which the difference in elapsed time Tp is shorter than the current detection period Pi. The second control unit 42 then ends the battery monitoring process.

For example, when monitoring the state of the battery module 11, the second control unit 42 calculates an internal resistance of the battery module 11 using the set of inter-terminal voltage V and charge-discharge current I, and monitors a state of degradation or the like of the battery module 11 using the calculated internal resistance. According to the present embodiment, the process at step S62 corresponds to a "state monitoring unit."

Figure 6:
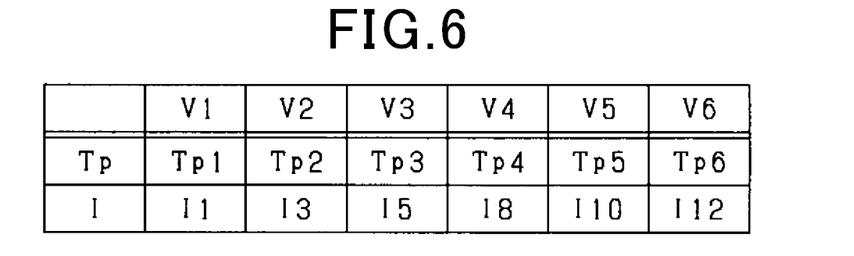
FIG. 6 is a table of a correspondence relationship among an inter-terminal voltage, elapsed time, and a charge-discharge current.

Next, FIG. 5 and FIG. 6 show an example of the battery monitoring process. Here, FIG. 5 shows the transitions of the voltage detection timing tv and the diagnosis timing te, the transition of the current detection timing ti, and the transition of the storage time Th. In addition, FIG. 6 shows a correspondence relationship among the inter-terminal voltage V, the elapsed time Tp, and the charge-discharge current I.

As shown in FIG. 5, the voltage detection period Pv includes six detection times Td corresponding to the number of battery modules 11 configuring the assembled battery 10 and the diagnosis time Tj. In the voltage detection period Pv, the diagnosis time Tj is set to follow the detection times Td of all of the battery modules 11. In FIG. 5, the inter-terminal voltages V of the battery modules 11 are referred to as V1 to V6 in order from the battery module 11 on the positive-terminal side, as shown in FIG. 1. Voltage detection timings tv1 to tv6 at which the inter-terminal voltages V1 to V6 are respectively detected are set in the respective detection times Td of the battery modules 11.

Meanwhile, as shown in FIG. 5, the current detection timing ti is repeatedly set at the current detection period Pi. In FIG. 5, a number n (n=1, 2, 3, . . . ) for identifying the order of the current detection timings from a predetermined reference timing t0 is attached to each of the current detection timings ti set after the reference timing t0. The charge-discharge current I detected at the current detection timing tin is referred to as a charge-discharge current In.

As shown in FIG. 5, each charge-discharge current In is stored in the second control unit 42 over the storage time Th and is deleted from the second control unit 42 after the elapse of the storage time Th. According to the present embodiment, the storage time Th is set to amount to 23 current detection periods Pi. Therefore, the storage time Th is set to be longer than the voltage detection period Pv that is set to amount to 20 current detection periods Pi.

In the example shown in FIG. 5 and FIG. 6, when the transmission request signal St for the inter-terminal voltage V1 is transmitted at a transmission timing tm1, as shown in FIG. 5, the inter-terminal voltage V1 acquired in association with elapsed time Tp1 from the voltage detection timing tv1 to the transmission timing tm1 (see FIG. 6). Then, a selection process in which the charge-discharge current (referred to, hereafter, as a corresponding charge-discharge current) In of which the current detection timing tin is closest to the voltage detection timing tv1 is selected is performed.

In the selection process, elapsed time Tpn from each current detection timing tin to the transmission timing tm1 is calculated for a plurality of charge-discharge currents In. Then, the charge-discharge current In corresponding to the elapsed time Tpn closest to the elapsed time Tp1, among the calculated elapsed times Tpn, is selected as the corresponding charge-discharge current In.

According to the present embodiment, the charge-discharge current In is acquired at each current detection period Pi and stored in the second control unit 42. Therefore, the second control unit 42 stores therein the charge-discharge currents In of which the difference between the elapsed time Tp1 and the elapsed time Tpn is shorter than the current detection period Pi, rather than based on the elapsed time Tp1, that is, the voltage detection timing tv1. Consequently, the charge-discharge current In can be selected as the corresponding charge-discharge current In of the inter-terminal voltage V1.

According to the present embodiment, a charge-discharge current I1 is selected as the corresponding charge-discharge current In of the inter-terminal voltage V1. As shown in FIG. 6, the inter-terminal voltage V1 and the charge-discharge current I1 are associated as the inter-terminal voltage V and the charge-discharge current I detected at substantially synchronized timings. Therefore, the state of the battery module 11 is appropriately monitored through use of the internal resistance of the battery module 11 calculated using the set of inter-terminal voltage V1 and charge-discharge current I1. This similarly applies to the inter-terminal voltages V2 to V6. Redundant descriptions are omitted.

According to the present embodiment described in detail above, the following effects are achieved.

According to the present embodiment, the charge-discharge current I is acquired at each current detection period Pi. Therefore, even when the inter-terminal voltage V is detected at an arbitrary voltage detection timing tv, the second control unit 42 stores therein the inter-terminal voltage V and the charge-discharge current I of which the difference in elapsed time Tp is shorter than the current detection period Pi and that are detected at substantially synchronized timings. Therefore, through use of this set of inter-terminal voltage V and charge-discharge current I, the state of the battery module 11 can be appropriately monitored using of the inter-terminal voltage V detected at the arbitrary voltage detection timing tv.

In particular, according to the present embodiment, the voltage detecting unit 21 and the current detecting unit 41 belong to differing apparatuses 20 and 40. In this case, unless a synchronization process to match reference times between the apparatuses 20 and 40 is performed, a difference between the respective reference times of the apparatuses 20 and 40 may occur. In addition, even if the synchronization process is performed, a difference between the respective reference times of the apparatuses 20 and 40 may occur if the amount of time elapsed from the synchronization process increases. Therefore, if time that is determined based on the reference times is used when the detection timings tv and ti are compared, a difference occurs between the detection timings tv and ti. The inter-terminal voltage V and the charge-discharge current I that are detected at synchronized timings cannot be selected.

According to the present embodiment, when the detection timings tv and ti are compared, the elapsed time Tp that is based on the transmission timing tm is used. The transmission timing tm is a timing that is shared between the apparatuses 20 and 40. Therefore, the occurrence of a difference between the detection timings tv and ti can be suppressed. The inter-terminal voltage V and the charge-discharge current I that are detected at synchronized timings can be appropriately selected.

According to the present embodiment, the current detection period Pi is shorter than the voltage detection period Pv. For example, when the current detection period Pi is longer than the voltage detection period Pv, the charge-discharge currents I corresponding to two inter-terminal voltages V that are successively detected regarding a certain battery module 11 may be charge-discharge currents I detected at the same current detection timing ti. The state of the battery module 11 cannot be appropriately monitored.

According to the present embodiment, because the current detection period Pi is shorter than the voltage detection period Pv, the charge-discharge currents I corresponding to two inter-terminal voltages V that are successively detected regarding a certain battery module 11 are charge-discharge currents I detected at differing current detection timings ti, at all times. Therefore, the state of the battery module 11 can be appropriately monitored through use of the charge-discharge current I that is updated in accompaniment with the update of the inter-terminal voltage V.

According to the present embodiment, the second control unit 42 stores therein the charge-discharge current I detected at each current detection period Pi by the current detecting unit 41. Therefore, in the second control unit 42, the storage capacity required to store the charge-discharge currents I increases. When the charge-discharge currents I stored in the second control unit 42 are excessively deleted to suppress the storage capacity required in the second control unit 42, the charge-discharge current I may be deleted before the inter-vehicle voltage C and the charge-discharge current I are associated According to the present embodiment, the storage time Th of the charge-discharge current I is set to be longer than the voltage detection period Pi. Therefore, the charge-discharge current I corresponding to the inter-terminal voltage V that has been detected last for each of the battery modules 11 is stored in the second control unit 42 at all times. Consequently, the charge-discharge current I being deleted the inter-terminal voltage V and the charge-discharge current I are associated can be appropriately suppressed.

According to the present embodiment, the voltage detection period Pv includes the diagnosis time Tj. Therefore, the inter-terminal voltage V and the charge-discharge current I can be associated using the diagnosis time Tj. In particular, according to the present embodiment, the diagnosis time Tj is set to follow the detection times Td of all of the battery modules 11. Consequently, as a result of the inter-terminal voltage V and the charge-discharge current I being associated using the diagnosis time Tj, the inter-terminal voltage V and the charge-discharge current I can be associated during the corresponding voltage detection period Pv.

Second Embodiment

A second embodiment will be described below with reference to FIG. 7 to FIG. 9, mainly focusing on the differences from the above-described first embodiment.

Figure 7:
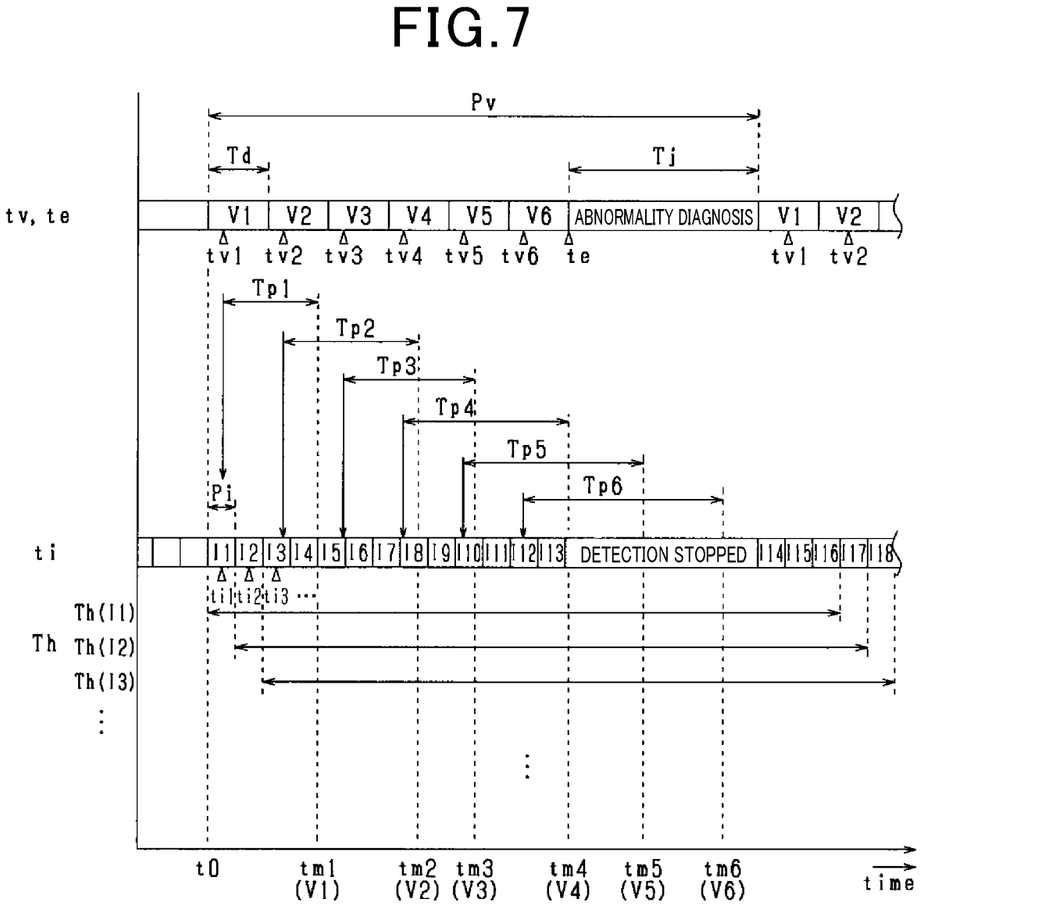
FIG. 7 is a time chart of an example of a battery monitoring process according to a second embodiment.

According to the present embodiment, as shown in FIG. 7, the detection of the charge-discharge current I is stopped during the diagnosis time Tj. FIG. 7 is a time chart of an example of the battery monitoring process according to the present embodiment.

Figure 8:
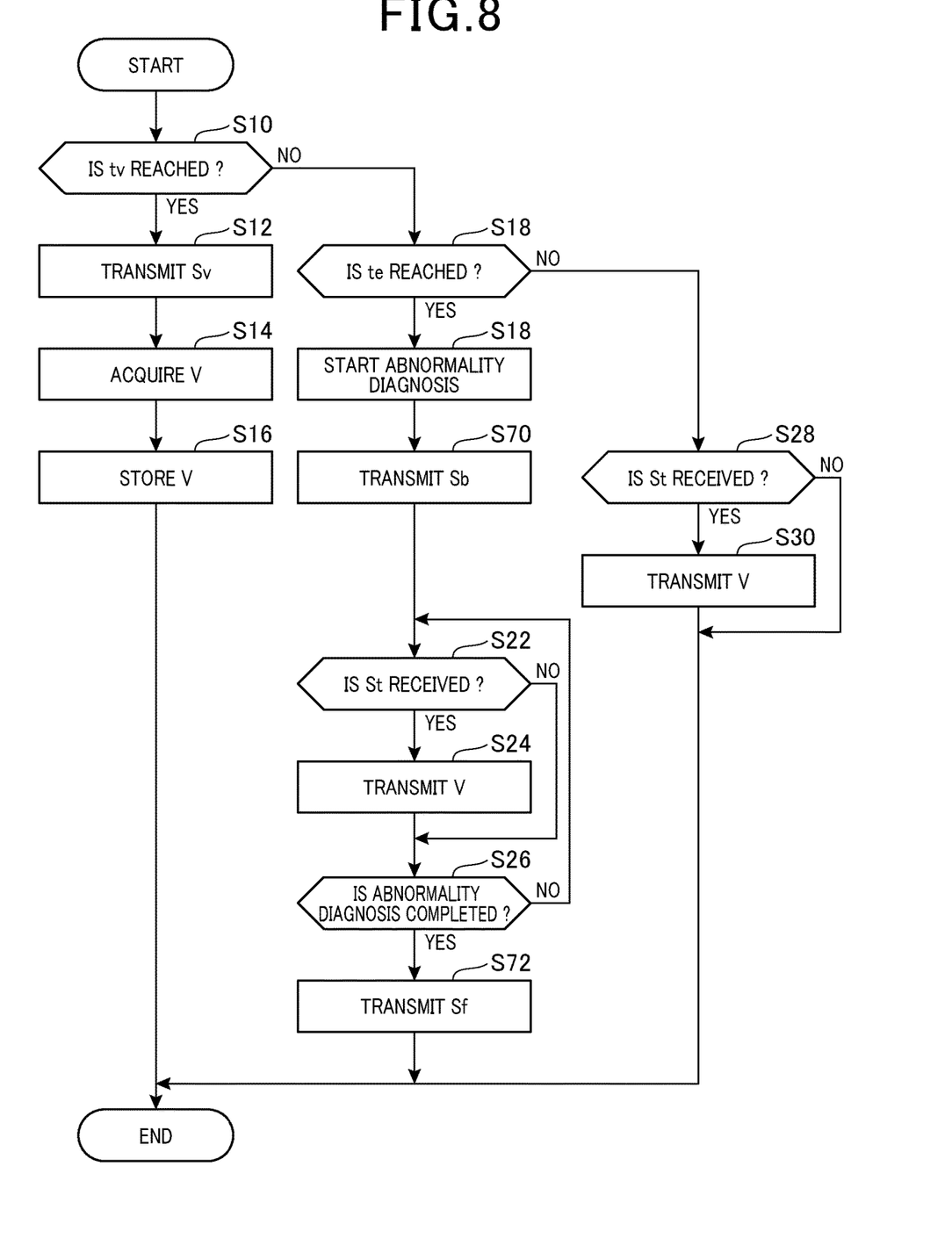
FIG. 8 is a flowchart of the steps in a voltage detection process according to the second embodiment.

FIG. 8 shows the steps in the voltage detection process according to the present embodiment. The first control unit 22 repeatedly performs the voltage detection process at the first processing cycle. In FIG. 8, processes that are the same as the processes shown in FIG. 3, described above, are given the same step numbers for convenience. Descriptions thereof are omitted.

According to the present embodiment, when the abnormality diagnosis is started at step S20, at step S70, the first control unit 22 transmits a diagnosis start signal Sb to the BMU 40. In addition, when a YES determination is made at step S26 that determines that the abnormality diagnosis is completed, at step S72, the first control unit 22 transmits a diagnosis end signal Sf to the BMU 40. The first control unit 22 then ends the voltage detection process. That is, the first control unit 22 transmits the diagnosis start signal Sb and the diagnosis end signal Sf, thereby notifying the BMU 40 of the start and end of the diagnosis time Tj.

Figure 9:
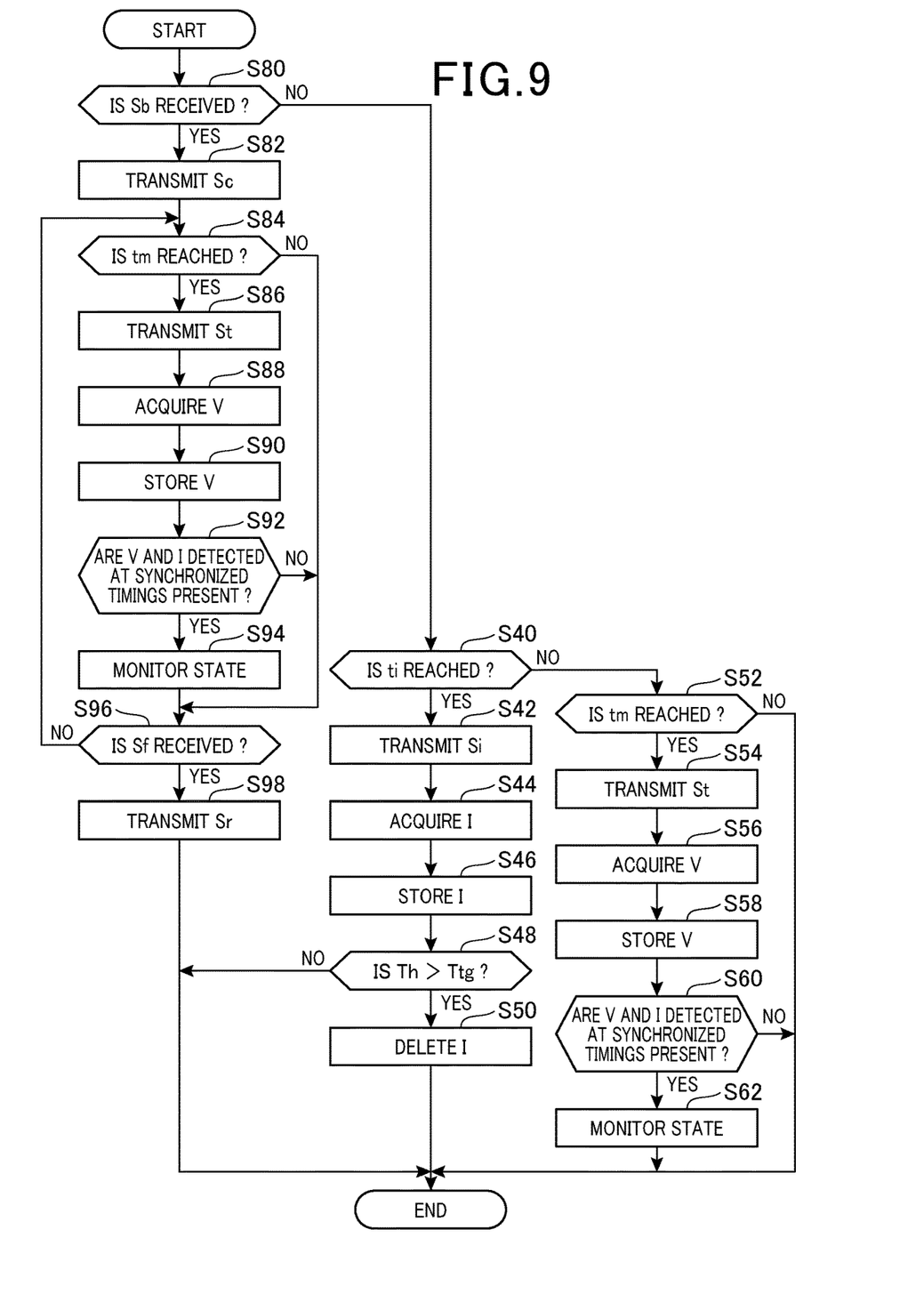
FIG. 9 is a flowchart of the steps in the battery monitoring process according to the second embodiment.

In addition, FIG. 9 shows the steps in the battery monitoring process according to the present embodiment. The second control unit 22 repeatedly performs the battery monitoring process at the second processing cycle. In FIG. 9, processes that are the same as the processes shown in FIG. 4, described above, are given the same step numbers for convenience. Descriptions thereof are omitted.

According to the present embodiment, when the battery monitoring process is started, first, at step S80, the second control unit 42 determines whether the diagnosis start signal Sb is received. When a NO determination is made at step S80 (i.e., the second control unit 42 determines that no diagnosis start signal Sb is received), the second control unit proceeds to step S40. When a YES determination is made at step S80 (i.e., the second control unit 42 determines that the diagnosis start signal Sb is received), at step S82, the second control unit 42 transmits a detection stop signal Sc to the current detecting unit 41 and stops the detection of the charge-discharge current I.

As a result, the current detecting unit 41 stops the detection of the charge-discharge current I, preparatory processes required for detection, and the like until a detection resume signal Sr, described hereafter, is received. According to the present embodiment, the process at step S82 corresponds to a "stop transmitting unit."

At subsequent steps S84 to S94, the second control unit 42 associates the inter-terminal voltage V and the charge-discharge current I detected at substantially synchronized timings. The second control unit 42 monitors the state of the battery module 11 using this set of inter-terminal voltage V and charge-discharge current I. The processes at steps S84 to S94 are substantially the same as the processes at steps S52 to S62, described above. Redundant descriptions are omitted.

At subsequent step S96, the second control unit 42 determines whether the diagnosis end signal Sf is received. When a NO determination is made at step S96 (i.e., the second control unit 42 determines that no diagnosis end signal Sf is received), the second control unit 42 returns to step S84. When a YES determination is made at step S96 (i.e., the second control unit 42 determines that the diagnosis end signal Sf is received), at step S98, the second control unit 42 transmits the detection resume signal Sr to the current detecting unit 41 and restarts the detection of the charge-discharge current I. That is, the current detecting unit 41 stops the detection of the charge-discharge current I, preparatory processes required for the detection, and the like during the diagnosis time Tj.

According to the present embodiment described above, the detection of the charge-discharge current I is stopped during the diagnosis time Tj. Because the current detecting unit 41 detects the charge-discharge current I at each current detection period Pi, the processing load related to the detection of the charge-discharge current I placed on the current detecting unit 41 is significant. According to the present embodiment, because the detection of the charge-discharge current I is stopped during the diagnosis time Tj, the process load placed on the current detecting unit 41 can be reduced.

Other Embodiments

The present disclosure is not limited to the content of the descriptions according to the above-described embodiments. The present disclosure may also be carried out in the following manner.

According to each of the above-described embodiments, the combination of the inter-terminal voltage V and the charge-discharge current I is given as an example of a combination of the first physical quantity and the second physical quantity. However, the present disclosure is not limited thereto. For example, two arbitrary physical quantities that are used to monitor the battery module 11 and are required to be detected at synchronized timings, such as a state of charge (SOC) and a temperature of each battery module 11, are applicable.

According to each of the above-described embodiments, an example is given in which the voltage detecting unit 21 detects the inter-terminal voltage V using the flying capacitor method. However, the present disclosure is not limited thereto. For example, the voltage detecting unit 21 may detect the inter-terminal voltage V using a resistance voltage-divider method, or by directly using an analog-to-digital (A/D) converter or the like.

According to each of the above-described embodiments, an example is given in which the inter-terminal voltage V is detected at the fixed voltage detection period Pv. However, as long as the voltage detection period Pv is a predetermined period prescribed in advance, the voltage detection period Pv is not necessarily required to be a fixed period. This similarly applies to the current detection period Pi. In this case, the current detection period Pi becomes shorter than the voltage detection period Pv as a result of a maximum period of the current detection period Pi being set to be shorter than a minimum period of the voltage detection period Pv.

The elapsed time Tp with reference to the transmission timing tm is given as an example of the time parameter.

However, the time parameter is not limited thereto. For example, the time parameter may be the times at which the inter-terminal voltage V and the charge-discharge current I are detected by the apparatuses 20 and 40. In this case, the synchronization process is required to be repeatedly performed at a predetermined cycle such that a difference does not occur between the reference times of the apparatuses 20 and 40.

The elapsed time Tp from the time of detection to the transmission timing tm is given as an example of the correlation value. However, the correlation value is not limited thereto. For example, the correlation value may be an elapsed time from the time of detection to a predetermined reference time. Alternatively, the correlation value may be predetermined number corresponding to the elapsed time, such as a number indicating the order of detection.

According to each of the above-described embodiments, an example in which the voltage detecting unit 21 and the current detecting unit 41 belong to differing apparatuses 20 and 40 is given. However, the voltage detecting unit 21 and the current detecting unit 41 may belong to the same apparatus. Even if the voltage detecting unit 21 and the current detecting unit 41 belong to the same apparatus, an issue similar to that described above arises in cases in which the inter-terminal voltage V is required to be detected at a detection timing prescribed in advance based on the current detection timing ti.

According to each of the above-described embodiments, an example in which the current detection period Pi is shorter than the detection time Td is given. However, the current detection period Pi may be longer than the detection time Td. In this case as well, the current detection period Pi is required to be shorter than the voltage detection period Pv.

The abnormality diagnosis is given as an example of the predetermined process. However, the predetermined process is not limited thereto. For example, the predetermined process may be a process such as detection of the respective temperatures of the battery modules 11, determination of whether or not the battery module 11 can be used based on the detected temperature, communication with another apparatus such as the BMU 40, and the like.

According to the above-described embodiment, an example in which the set time Ttg is shorter than twice the voltage detection period Pv is given. However, the present disclosure is not limited thereto. The set time Ttg may be shorter than m-times (m=3, 4, 5, . . . ) the voltage detection period Pv. However, the storage capacity set in the second control unit 42 for storage of the charge-discharge currents I increases as m increases.

Figure 10:
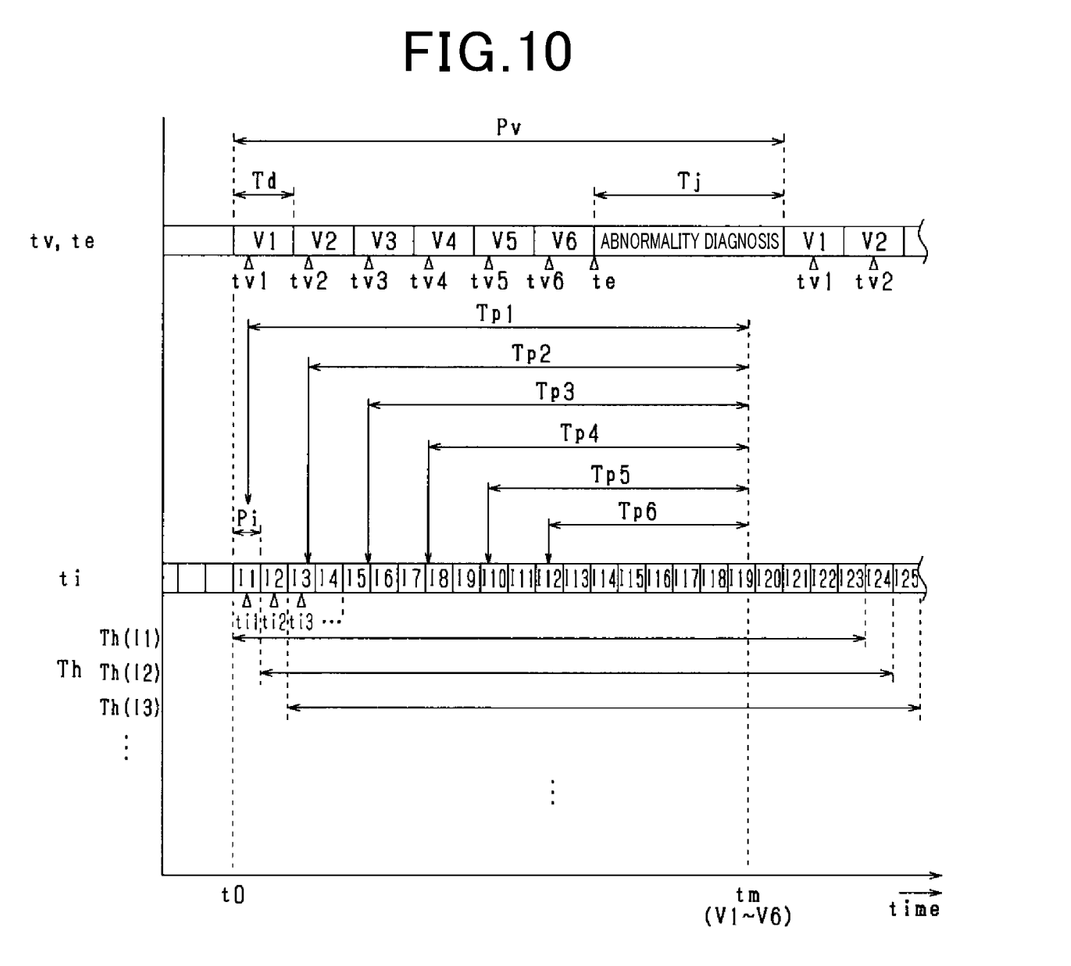
FIG. 10 is a time chart of an example of a battery monitoring process according to another embodiment.

According to the above-described embodiments, an example in which the transmission timing tm of the transmission request signal St differs for each of the battery modules 11 is given. However, the present disclosure is not limited thereto. For example, as shown in FIG. 10, the transmission timing tm of the transmission request signal St may be the same for all of the battery modules 11. In this case as well, because the elapsed time Tp for each battery module 11 differs, the corresponding charge-discharge current I of each inter-terminal voltage V is a charge-discharge current I detected at a differing current detection timing ti.

What is claimed is:

1. A battery monitoring apparatus for a battery monitoring system that includes a first sensor that detects a first physical quantity of a storage battery and a second sensor that detects a second physical quantity of the storage battery, the battery monitoring apparatus comprising:

a processor programmed to
acquire the first physical quantity detected by the first sensor,
acquire the second physical quantity detected by the second sensor at a predetermined detection period,
store the acquired first physical quantity and the acquired second physical quantity in association with a time parameter, the time parameter being a time of detection of the respective first or second physical quantity or a correlation value that is correlated with the time of detection of the respective first or second physical quantity, and
monitor a state of the storage battery using a set of first physical quantity and second physical quantity of which a difference in the time of detection is shorter than the detection period, among the first physical quantities and the second physical quantities stored, based on the time parameter.

2. The battery monitoring apparatus according to claim 1, wherein:
the battery monitoring system includes
a first apparatus that includes the first sensor, and
a second apparatus that includes the second sensor and the battery monitoring apparatus, the first apparatus and the second apparatus being communicably connected,
the processor is provided in the second apparatus and is further programmed to
transmit a transmission request signal, and
acquire the first physical quantity, in association with the time parameter thereof, that is transmitted from the first apparatus based on the transmission request signal, and
the time parameter is elapsed time from a time at which the first physical quantity and the second physical quantity are detected to a time at which the transmission request signal is transmitted.

3. The battery monitoring apparatus according to claim 2, wherein:
the processor acquires the first physical quantity that is detected by the first sensor at each predetermined first detection period,
the detection period in the second sensor is a second detection period, and
the second detection period is shorter than the first detection period.

4. The battery monitoring apparatus according to claim 3, wherein:
the first detection period includes a control time during which the detection of the first physical quantity by the first sensor is stopped and a predetermined process to control the storage battery is performed, and
the processor is further programmed to transmit a detection stop signal that stops the detection of the second physical quantity to the second sensor during the control time.

5. The battery monitoring apparatus according to claim 3, wherein:
the processor is further programmed to delete the second physical quantity of which a storage time exceeds a predetermined set time that is longer than the first detection period, among the second physical quantities stored.

6. The battery monitoring apparatus according to claim 4, wherein:
the processor is further programmed to delete the second physical quantity of which a storage time exceeds a predetermined set time that is longer than the first detection period, among the second physical quantities stored.

7. A battery monitoring system comprising:
a first sensor that detects a first physical quantity of a storage battery;
a second sensor that detects a second physical quantity of the storage battery; and
a battery monitoring apparatus,
the battery monitoring apparatus comprising a processor programmed to:
   acquire the first physical quantity detected by the first sensor,
   acquire the second physical quantity detected by the second sensor at a predetermined detection period,
   store the acquired first physical quantity and the acquired second physical quantity in association with a time parameter, the time parameter being a time of detection of the respective first or second physical quantity or a correlation value that is correlated with the time of detection of the respective first or second physical quantity, and
   monitor a state of the storage battery using a set of first physical quantity and second physical quantity of which a difference in the time of detection is shorter than the detection period, among the first physical quantities and the second physical quantities stored, based on the time parameter.

8. A battery monitoring method for a battery monitoring system that includes a first sensor that detects a first physical quantity of a storage battery and a second sensor that detects a second physical quantity of the storage battery, the battery monitoring method comprising:
   acquiring, by the battery monitoring apparatus, the first physical quantity detected by the first sensor;
   acquiring, by the battery monitoring apparatus, the second physical quantity detected by the second sensor at a predetermined detection period;
   storing, by the battery monitoring apparatus, the first physical quantity and the second physical quantity acquired by the battery monitoring apparatus in association with a time parameter, the time parameter being a time of detection of the respective first or second physical quantity or a correlation value that is correlated with the time of detection of the respective first or second physical quantity; and
   monitoring, by the battery monitoring apparatus, a state of the storage battery using a set of first physical quantity and second physical quantity of which a difference in the time of detection is shorter than the detection period, among the first physical quantities and the second physical quantities stored by the by the battery monitoring apparatus, based on the time parameter.

* * * * *